(12) United States Patent
Nonaka et al.

(10) Patent No.: US 7,954,533 B2
(45) Date of Patent: Jun. 7, 2011

(54) SHEET CUTTING TABLE

(75) Inventors: Hideaki Nonaka, Tokyo (JP); Kenji Kobayashi, Tokyo (JP); Yoshiaki Sugishita, Tokyo (JP)

(73) Assignee: Lintec Corporation, Tokyo (JP)

( * ) Notice: Subject to any disclaimer, the term of this patent is extended or adjusted under 35 U.S.C. 154(b) by 274 days.

(21) Appl. No.: 12/067,280

(22) PCT Filed: Oct. 5, 2006

(86) PCT No.: PCT/JP2006/319931
§ 371 (c)(1),
(2), (4) Date: Mar. 18, 2008

(87) PCT Pub. No.: WO2007/049441
PCT Pub. Date: May 3, 2007

(65) Prior Publication Data
US 2009/0151875 A1 Jun. 18, 2009

(30) Foreign Application Priority Data
Oct. 24, 2005 (JP) .................. 2005-308272

(51) Int. Cl.
| | | |
|---|---|---|
| B29C 65/00 | (2006.01) | |
| B29C 65/10 | (2006.01) | |
| B32B 37/00 | (2006.01) | |
| B32B 38/04 | (2006.01) | |
| B32B 38/10 | (2006.01) | |
| B32B 41/00 | (2006.01) | |
| B31F 5/00 | (2006.01) | |
| G03D 15/04 | (2006.01) | |
| B26D 5/00 | (2006.01) | |
| B26D 1/14 | (2006.01) | |
| B26D 1/18 | (2006.01) | |
| B65C 9/40 | (2006.01) | |
| G05G 15/00 | (2006.01) | |
| B23D 33/02 | (2006.01) | |
| B27B 5/00 | (2006.01) | |
| B27B 5/18 | (2006.01) | |
| B27B 27/06 | (2006.01) | |
| B27B 5/34 | (2006.01) | |
| B27B 3/28 | (2006.01) | |
| B27B 27/04 | (2006.01) | |
| A47G 29/00 | (2006.01) | |
| F16M 11/00 | (2006.01) | |

(52) U.S. Cl. ........ 156/510; 156/506; 156/353; 156/497; 156/250; 83/471; 83/471.1; 83/471.2; 83/471.3; 83/472; 83/473; 83/474; 83/475; 83/476; 83/477; 83/477.1; 83/477.2; 248/683; 248/684

(58) Field of Classification Search .................. 156/510, 156/506, 375, 497, 250, 353; 83/471–477.2; 248/683–684
See application file for complete search history.

(56) References Cited

U.S. PATENT DOCUMENTS
4,172,750 A * 10/1979 Giulie ........................ 156/267
(Continued)

FOREIGN PATENT DOCUMENTS
JP         61-276231 A     12/1986
(Continued)

OTHER PUBLICATIONS
PCT/JP2006/319931 International Search Report.

*Primary Examiner* — Khanh Nguyen
*Assistant Examiner* — Matthew Hoover
(74) *Attorney, Agent, or Firm* — Lowe Hauptman Ham & Berner LLP

(57) ABSTRACT

A sheet cutting table 13, after sticking an adhesive sheet S to a semiconductor wafer W, for cutting the area outside the semiconductor wafer W as an unnecessary adhesive sheet S1 with a cutting device 15. The table 13 includes an inner table 52 which supports the semiconductor wafer W, and an outer table 51 corresponding to the unnecessary adhesive sheet S1 outside the semiconductor wafer W. The upper surface of the outer table 51 is provided with a non-adherable treatment surface 51A, and an adherable member formed with a ring member 53 or a plate member 63 for sticking the adhesive sheet S thereto.

17 Claims, 5 Drawing Sheets

U.S. PATENT DOCUMENTS

| | | | |
|---|---|---|---|
| 5,808,274 A * | 9/1998 | Lee | 219/121.72 |
| 6,803,320 B2 * | 10/2004 | Yamamoto | 438/710 |
| 2003/0062116 A1 * | 4/2003 | Lee | 156/249 |
| 2004/0031570 A1 * | 2/2004 | Kim et al. | 156/510 |
| 2004/0140039 A1 | 7/2004 | Yamamoto | |
| 2005/0173064 A1 * | 8/2005 | Miyanari | 156/344 |
| 2005/0282362 A1 * | 12/2005 | Kobayashi et al. | 438/464 |

FOREIGN PATENT DOCUMENTS

| | | | |
|---|---|---|---|
| JP | 2001-063908 A | | 3/2001 |
| JP | 2001-219936 A | | 8/2001 |
| JP | 2002-176011 A | | 6/2002 |
| JP | 2004-047976 A | | 2/2004 |
| JP | 2004047976 A | * | 2/2004 |
| JP | 2004-221469 A | | 8/2004 |
| JP | 2004-262235 A | | 9/2004 |
| JP | 2004-266183 A | | 9/2004 |
| JP | 2005-116711 A | | 4/2005 |
| JP | 2005-198806 A | | 7/2005 |
| JP | 2005-229226 A | | 8/2005 |
| JP | 2005-243888 A | | 9/2005 |
| JP | 2006-095606 A | | 4/2006 |
| JP | 2006-102822 A | | 4/2006 |
| JP | 2006-108503 A | | 4/2006 |
| JP | 2007-019239 A | | 1/2007 |

* cited by examiner

SHEET CUTTING TABLE

RELATED APPLICATIONS

The present application is based on, and claims priority from, International Application No. PCT/JP2006/319931, filed Oct. 5, 2006 and Japan Application No. 2005-308272, filed Oct. 24, 2005 the disclosures of which are hereby incorporated by reference herein in their entirety.

FIELD OF THE INVENTION

The present invention relates to a sheet cutting table, particularly to a sheet cutting table capable of performing a cutting operation without causing wrinkles on the adhesive sheet which is stuck to a plate-like object, when cutting the adhesive sheet along the periphery of the plate-like object.

BACKGROUND OF THE ART

Conventionally, the plate-like object such as a semiconductor wafer (hereinafter, simply referred to as "wafer") is stuck with a protective sheet for protecting circuit surface thereof, and stuck with a heat sensitive adhesive sheet on the rear surface or front surface thereof.

As a sheet sticking method described above, the following method is known. That is, using a raw sheet in which a strip of adhesive sheet is temporarily stuck on a strip of release liner, and after peeling off the adhesive sheet from the release liner and sticking the same onto a wafer, the adhesive sheet is cut along the periphery of the wafer; thus the adhesive sheet is stuck onto the wafer (refer to, for example, patent document 1).

Patent Document 1: Japanese Patent Application Laid-Open No. 2002-176011

SUMMARY OF THE INVENTION

Problem to be Solved by the Invention

However, in the cutting device disclosed in the patent document 1, an unnecessary adhesive sheet formed around the wafer must be peeled off from the table. Therefore, it is common that the upper surface of the table is provided with a special treatment, for example, a surface treatment typified by fluororesin treatment to form a non-adherable treatment surface so that the narrowed area in the unnecessary adhesive sheet will not be torn owing to sticking tightly to the table when the pull force of peeling is applied.

However, when the non-adherable treatment surface described above is provided on the whole area of the upper surface of the table around the wafer, that may cause a disadvantage that the adhesive sheet cannot be cut neatly along the periphery of the wafer during the cutting operation with the cutter blade owing to wrinkles caused by displacement of the adhesive sheet by being pulled, and whereby the wrinkles get into the wafer side. Such a disadvantage becomes more obvious as wear of the cutter blade increased.

Object of the Invention

The present invention has been proposed in view of the above disadvantage. It is an object of the present invention to provide a sheet cutting table capable of cutting the adhesive sheet with a high degree of accuracy by preventing the occurrence of wrinkles during the cutting operation.

Means for Solving Problems

To achieve the above object, the present invention adopts such an arrangement that a sheet cutting table, after sticking an adhesive sheet having a larger plane area than that of a plate-like object to the plate-like object, for cutting the area outside the plate-like object as an unnecessary adhesive sheet, includes an inner table which forms a surface to place the plate-like object thereon, and an outer table, which is located outside the inner table, corresponding to the unnecessary adhesive sheet area, wherein the upper surface of the outer table is formed as a non-adherable treatment surface, and a part of the area is provided with an adherable member which is capable of sticking the unnecessary adhesive sheet area thereto.

In the present invention, the adherable member may be detachably provided to the sheet cutting table, and the sticking area can be increased and decreased corresponding to the adhesive force of the adhesive sheet.

Also, the adherable member includes one or more members which may be detachably provided to the sheet cutting table, and the number of members can be increased and decreased corresponding to the adhesive force of the adhesive sheet.

Further, the adherable member may be provided like a closed-loop surrounding the periphery of the plate-like object.

Furthermore, such an arrangement may be adopted that the adherable members can be provided at interspaces on the outer periphery of the plate-like object.

Still further, such an arrangement may be adopted that the adherable member can be warmed using a thermal conduction unit or a heater.

Effect of the Invention

According to the present invention, since the upper surface of the outer table is formed as a non-adherable treatment surface, and a part of the area is provided with an adherable member which is capable of sticking the adhesive sheet thereto, the unnecessary adhesive sheet area is to be partially stuck to the adherable member. Therefore, even if the pull force is applied to the adhesive sheet with the cutter blade, the unnecessary adhesive sheet area is not moved, and the potential wrinkles are prevented from occurring on the adhesive sheet, whereby the cutting operation can be performed with a high degree of accuracy.

Particularly, when the adherable member is provided like a closed-loop surrounding the periphery of the plate-like object, allowance of causing wrinkles can be eliminated completely, whereby the cutting operation can be performed with a further enhanced accuracy.

Also, even when the adherable members are provided at interspaces on the outer periphery of the plate-like object, the wrinkles can be prevented from occurring on the adhesive sheet by figuring out positioning and allocation of the sticking surfaces.

EXPLANATION OF REFERENCE NUMERALS

13: table
51: outer table
51A: non-adherable treatment surface
53: ring member (adherable member)
63: plate member (adherable member)
52: inner table
W: wafer (plate-like object)
S: adhesive sheet
S1: unnecessary adhesive sheet

BEST MODE FOR CARRYING OUT THE INVENTION

Hereinafter, an embodiment of the invention will be described with reference to the drawings.

Figure 1:
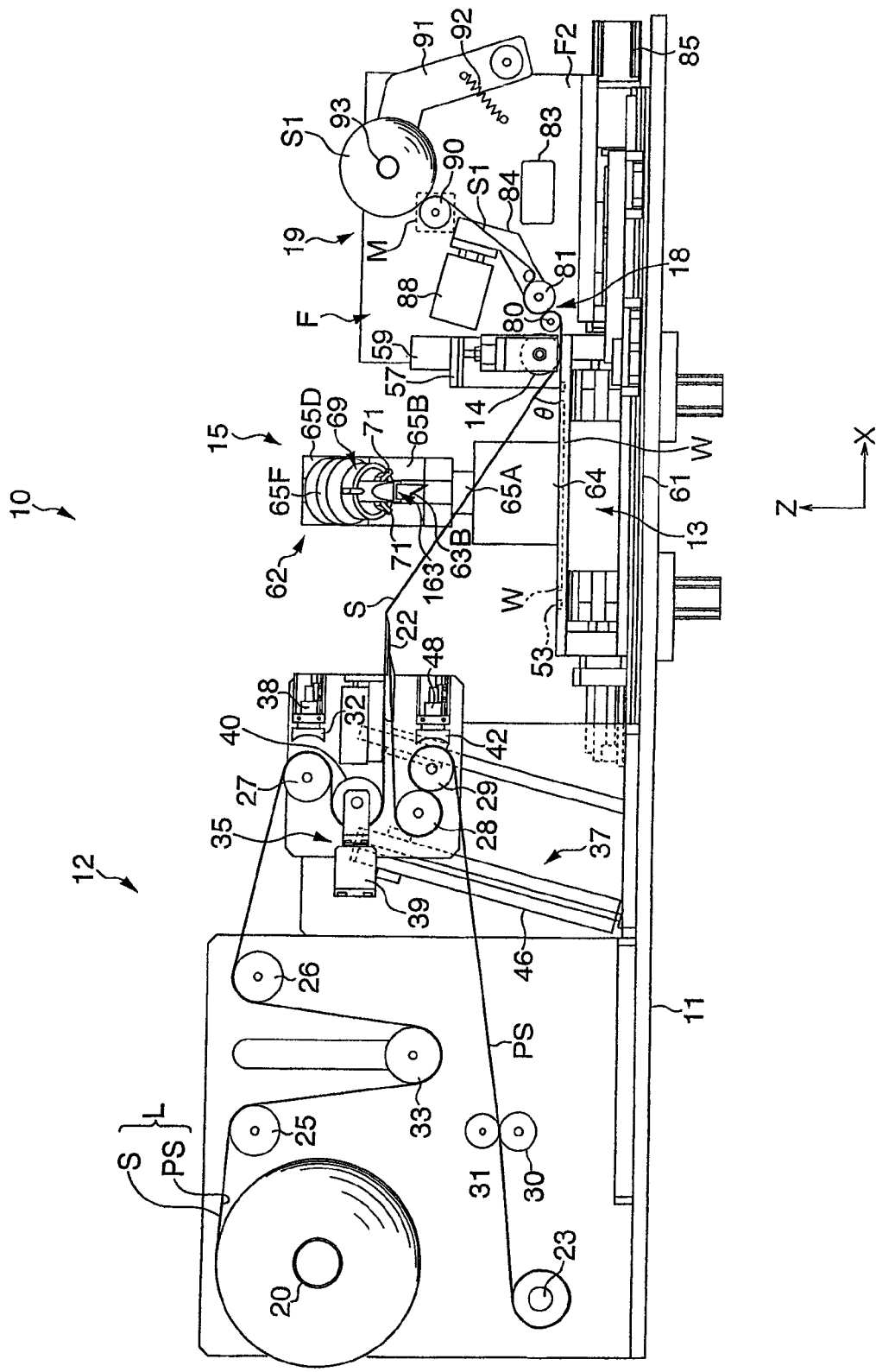
FIG. 1 is a front view schematically showing a sheet sticking apparatus in accordance with an embodiment.
Figure 2:
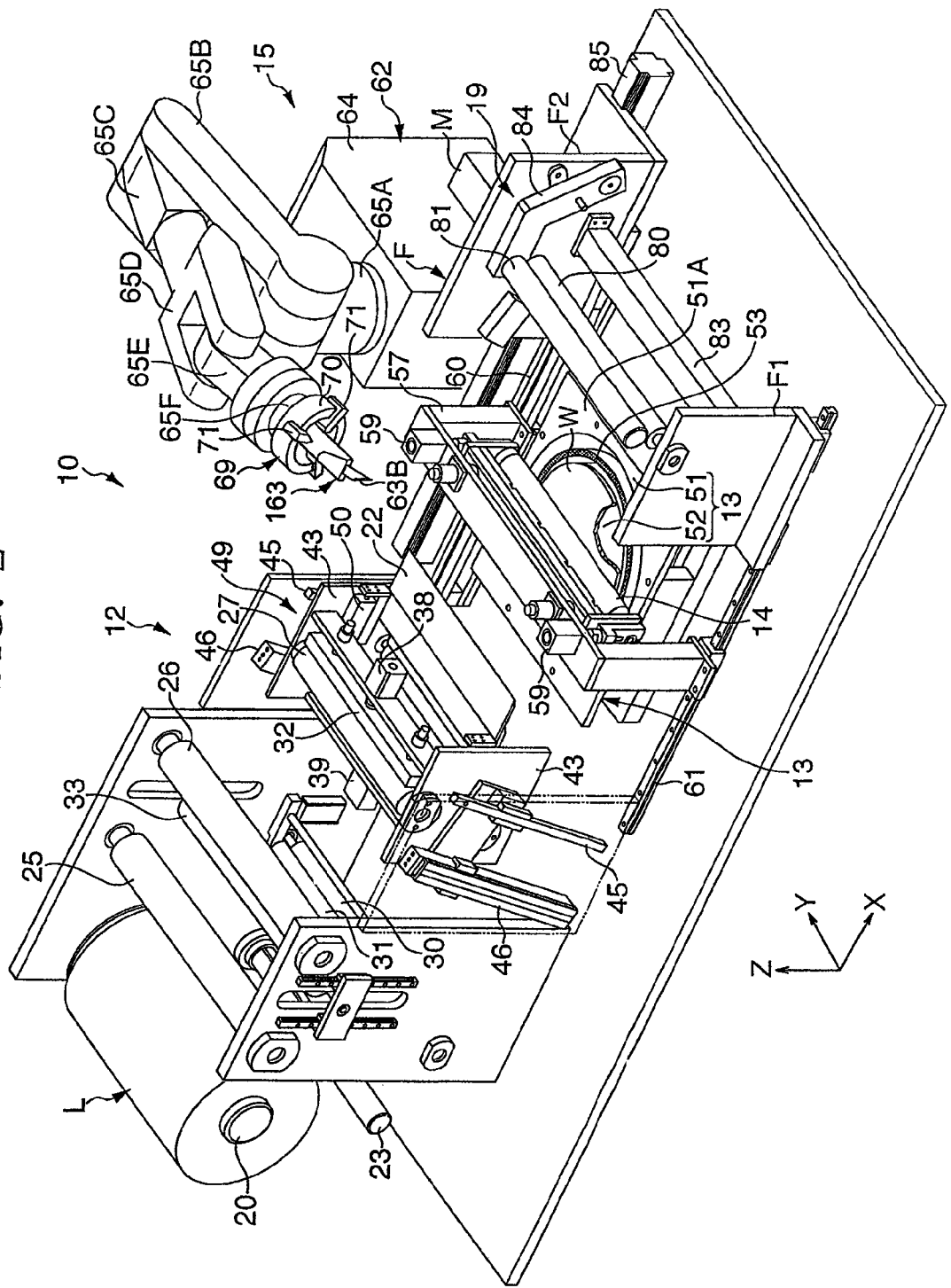
FIG. 2 is a perspective view schematically showing the sheet sticking apparatus.

FIG. 1 is a front view schematically showing a sheet sticking apparatus to which a sheet cutting table according to the present invention is applied; and FIG. 2 is a schematic perspective view thereof. In these figures, a sheet sticking apparatus 10 comprises: a sheet feed-out unit 12 disposed in the upper portion of a base 11; a table 13 for supporting a wafer W as a plate-like object; a press roller 14 for imparting a press force to a pressure sensitive adhesive sheet S fed out to the upper surface side of the wafer W to stick the adhesive sheet S to the wafer W; a cutting device 15 for cutting the adhesive sheet S along the periphery of the wafer W after sticking the adhesive sheet S thereto; a peeling device 18 for peeling off the area outside the wafer W as an unnecessary adhesive sheet S1 (see FIG. 3 and FIG. 4) from the upper surface of the table 13; and a winding device 19 for winding the unnecessary adhesive sheet S1.

The sheet feed-out unit 12 comprises: a support roller 20 for supporting a rolled raw sheet L in which a strip of adhesive sheet S is temporarily stuck on one surface of a strip of a release liner PS; a peel plate 22 with which the raw sheet L fed out from the support roller 20 is sharply folded back to peel off the adhesive sheet S from the release liner PS; a collection roller 23 for collecting the release liner PS by winding the same; a plurality of guide rollers 25 to 31 disposed between the support roller 20 and the collection roller 23; a buffer roller 33 disposed between the guide rollers 25 and 26; a tension measuring means 35 disposed between the guide rollers 27 and 28, which includes a load cell 39 and a tension measuring roller 40 supported by the load cell 39 and positioned at the base side of the peel plate 22; and a sticking-angle maintaining means 37 for integrally supporting the peel plate 22, guide rollers 27, 28, 29, and the tension measuring means 35, which interacts with the press roller 14 to maintain a constant sticking angle θ of the adhesive sheet S to the wafer W. The guide rollers 27 and 29 are provided with brake shoes 32, 42 respectively. These brakes hoes 32 and 42 are arranged so as, when sticking the adhesive sheet S to the wafer W, to be moved toward/away from the corresponding guide rollers 27, 29, by means of cylinders 38 and 48 respectively, to nip the adhesive sheet S to restrain the feeding thereof.

Note that the sheet feed-out unit 12, and the tension measuring means 35 and the sticking-angle maintaining means 37, which constitute the sheet feed-out unit, are identical to those disclosed in the Japanese Patent Application No. 2005-198806 filed by the applicant of the present invention. Therefore, detailed description thereof will be omitted here.

Figure 3:
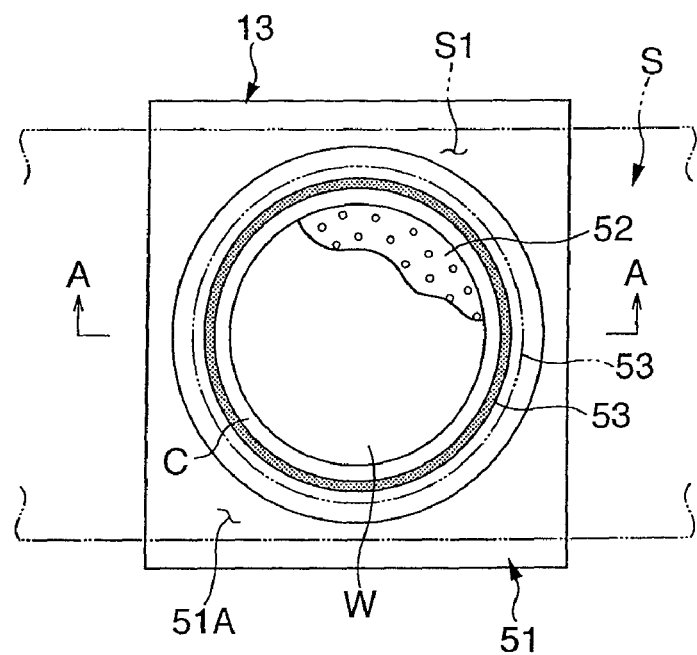
FIG. 3 is a plan view schematically showing a sheet cutting table.
Figure 4:
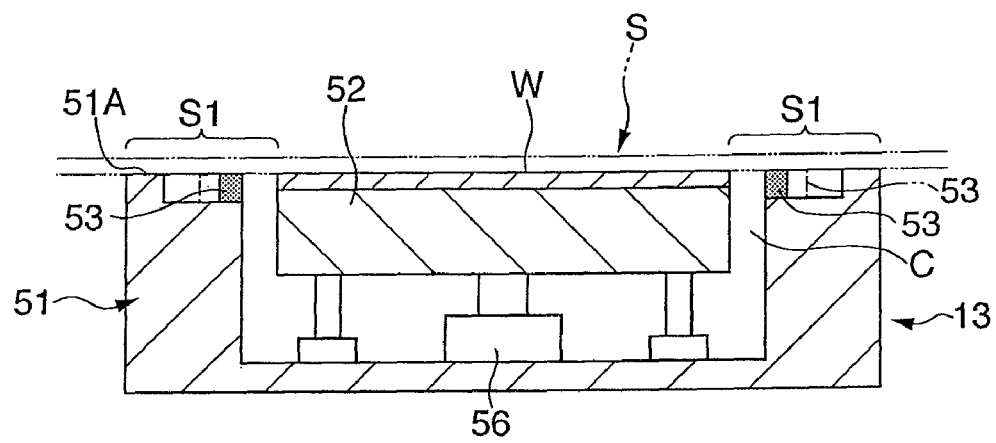
FIG. 4 is an enlarged cross sectional view taken along line A-A in FIG. 3.

As shown in FIG. 3 and FIG. 4, the table 13 comprises: an inner table 52 having a substantially circular shape in plane view, which sucks and supports the wafer W to form a surface to place the wafer W thereon; and an outer table 51 having a substantially square shape in plane view which is provided so as to form a gap C with the peripheral edge of the inner table 52. The outer table 51 includes a concave portion capable of receiving the inner table 52 and is arranged so as to move in the vertical direction to the base 11 via a uniaxial robot (not shown). On the other hand, the inner table 52 is arranged so as to move in the vertical direction to the outer table 51 via a uniaxial robot 56. Accordingly, the outer table 51 and the inner table 52 are arranged so as to move integrally in the vertical direction as well as to move in the vertical direction independently each other. Owing to this, the outer table 51 and the inner table 52 are arranged to be adjustable to a predetermined level position corresponding to the thickness of the adhesive sheet S and the wafer W.

The outer table 51 is formed as a non-adherable treatment surface 51A which is applied with fluororesin treatment on the upper surface so that the sticking surface side of the adhesive sheet S is not to stick thereto, and a ring member 53 which is made of a stainless material being not applied with fluororesin treatment so as to form an adherable member is disposed on the inner periphery area thereof, and is fixed by a fixing tool (not shown) thereto. Although the adherable member is made up of a stainless material in this embodiment, the present invention is not limited to the above but may be made up of also other materials such as an iron material and an aluminum material. The ring member 53 is arranged that when the adhesive sheet S is positioned on the wafer W and the outer table 51, and a press force for sticking is imparted to the adhesive sheet S by the press roller 14, the adhesive sheet S is stuck thereto as well as to the upper surface of the wafer W. Note that the ring member 53 may internally include a heater such as a nichrome wire heater whereby the adhesive force of the adhesive sheet S to the ring member 53 becomes controllable, and also becomes capable of responding to such a case that the adhesive sheet S is a heat sensitive adhesive sheet, i.e., no adhesiveness without sensing heat. Optionally, the heater may be arranged to be provided inside the outer table 51 instead of inside the ring member 53 so as to warm the ring member 53 indirectly. Further, as shown by the two-dot chain line in FIG. 3 and FIG. 4, a plurality of ring members 53 can be attached, wherein the number of members may increase and decrease corresponding to the adhesive force of the adhesive sheet S.

The press roller 14 is supported via a portal frame 57. On the upper surface side of the portal frame 57, cylinders 59, 59 are provided. The press roller 14 is arranged so as to move in the vertical direction owing to the operation of these cylinders 59. As shown in FIG. 2, the portal frame 57 is arranged to be movable in the X-direction in the figure via a uniaxial robot 60 and a guide rail 61.

The cutting device 15 is constituted of a multi-joint robot. The cutting device 15 comprises a robot body 62, and a cutter blade 163 supported at the free-end side of the robot body 62. The robot body 62 includes a base section 64, first to sixth arms 65A to 65F disposed at the upper surface side of the base section 64 so as to be rotatable in the predetermined directions, and a tool holding chuck 69 attached to the front end of the sixth arm 65F, i.e., at the free-end side of the robot body 52. The tool holding chuck 69 comprises a cutter blade receiver 70 having a substantially cylindrical shape, and three chuck claws 71 disposed at positions substantially 120 degrees away from each other in the peripheral direction of the cutter blade receiver 70, that detachably hold the cutter blade 163 having a blade 63B. Specifically, the cutting device 15 in this embodiment is identical to that disclosed in the Japanese Patent Application No. 2005-229226 already filed by the applicant of the present invention, therefore detailed description thereof is omitted.

As shown in FIG. 1, the peeling device 18 comprises a small diameter roller 80 and a large diameter roller 81. A moving frame F supports the small diameter roller 80 and the large diameter roller 81. The moving frame F comprises a front frame F1 and a rear frame F2, relatively disposed along the Y-direction in FIG. 2, wherein the rear frame F2 is coupled with the front frame F1 via a connecting member 83. The rear frame F2 is supported by a uniaxial robot 85, while the front frame F1 is supported by the guide rail 61. Owing to this, the moving frame F is movable in X-direction in FIG. 2. An arm member 84 supports the large diameter roller 81. The arm member 84 is arranged so that the large diameter roller 81 can move in the direction closer to/away from the small diameter roller 80 by a cylinder 88.

The winding device 19 comprises: a drive roller 90 supported by the moving frame F; and a winding roller 93, which is supported at the free-end of the rotation arm 91 being abutted on the circumferential surface of the drive roller 90 via a spring 92 to nip the unnecessary adhesive sheet S1. A drive motor M is disposed at the shaft end of the drive roller 90, and it is arranged so that, when the drive roller 90 is driven to rotate by the motor M, the winding roller 93 follows the drive roller 90 to rotate; whereby the unnecessary adhesive sheet S1 is wound thereon. Note that as the wound amount increases, the winding roller 93 shifts rightward in FIG. 1 against the force of the spring 92.

Next, a cutting method of the adhesive sheet S in this embodiment will be described. Note that the sticking method of the adhesive sheet S is substantially identical to that disclosed in the Japanese Patent Application No. 2005-198806. Here, in the unnecessary adhesive sheet S1 around the wafer W, only the area corresponding to the upper surface of the ring member 53 sticks in a relatively strongly manner, and the other area maintains in a state of lightly sticking or without sticking to the upper surface of the outer table 51, i.e., the non-adherable treatment surface 51A.

The cutting device 15 reads out the movement track data stored in a storage of a control device (not shown), and the blade 63B cuts the adhesive sheet S along the periphery of the wafer W on the inner table 52. Here, since the ring member 53 sticks to the unnecessary adhesive sheet S1 partially, the adhesive sheet area between the peripheral edge of the wafer W and the ring member 53 maintains in a tautened state. Owing to this, the adhesive sheet S is not dragged and moved by the pull force of the blade 63B when the blade 63B moves, and wrinkles are prevented from occurring on the wafer W side.

After the cutting operation has been completed along the periphery of the wafer W, when the wafer W is removed from the inner table 52 via a transfer device (not shown), the winding unit 19 winds the unnecessary adhesive sheet S1. In the winding operation, since the unnecessary adhesive sheet S1 is only partially stuck to the ring member 53, peeling can be easily performed by rolling up of the small diameter roller 80, thereby preventing occurrence of problems in winding such as tears and stretches of unnecessary adhesive sheet S1.

Note that since the winding operation is identical to the operation disclosed in the Japanese Patent Application No. 2005-198806, detailed description thereof is omitted here.

Therefore, according to the embodiment as described above, since the unnecessary adhesive sheet S1 around the wafer W partially sticks to the upper surface of the ring member 53 along the closed-loop movement track when cutting the adhesive sheet S along the periphery of the wafer W, the unnecessary adhesive sheet S1 that is the area outside the cutting position is not to be dragged and moved during the cutting operation with the blade 63B along the periphery of the wafer W. Owing to this, such an effect is obtained that the cutting operation can be performed with a high degree of accuracy without causing wrinkles and the like on the adhesive sheet S and the wafer W side.

The best arrangement and method for carrying out the present invention have been disclosed so far. However, the present invention is not limited to the above.

That is, the present invention has been illustrated and described mainly about a specific embodiment. However, it is possible for those skilled in the art to add various modifications, if necessary, to the above-described embodiment with respect to the shape, position and/or disposition without departing from the technical spirit and the range of the object of the present invention.

Figure 5:
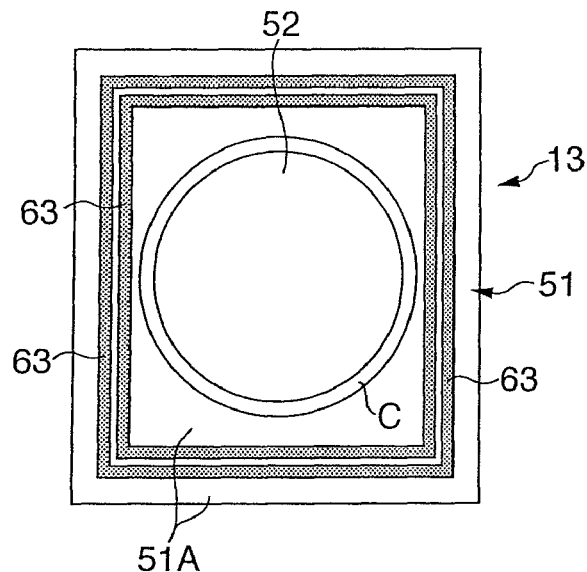
FIG. 5 is a plan view schematically showing an alternative example of the sheet cutting table.
Figure 6:
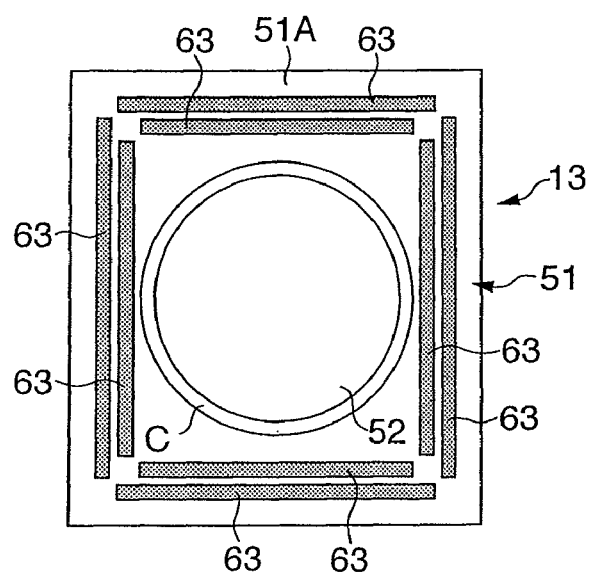
FIG. 6 is a plan view schematically showing another alternative example of the sheet cutting table.
Figure 7:
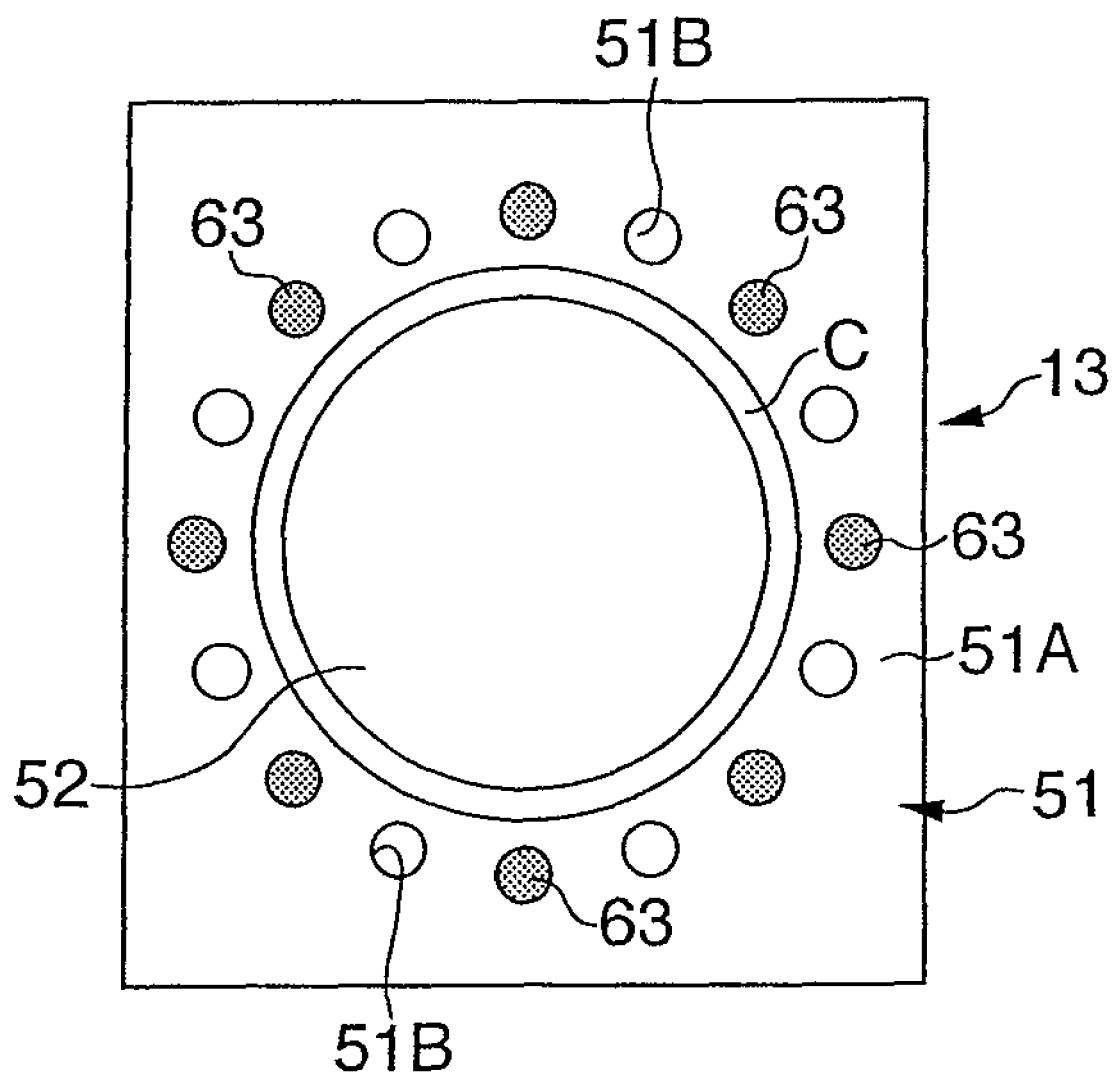
FIG. 7 is a plan view schematically showing a further alternative example of the sheet cutting table.

For example, in the above embodiment, an arrangement is described that a plurality of ring members 53 can be attached and the number of members may increase and decrease corresponding to the adhesive force of the adhesive sheet S. However, instead of it, another arrangement can be adopted that a several types of ring members 53 which have different sizes in the sticking area are prepared to be selectively replaced corresponding to the adhesive force. Also, in the above embodiment, an example in which the adhesive surface is formed with the ring members 53 along the outer periphery of the wafer W is illustrated and described. However, such arrangements shown in FIG. 5 to FIG. 7 can be also adopted. That is, in an example shown in FIG. 5, a plurality of plate members 63 formed with frames are disposed as the adherable members along the substantially square shaped tracks corresponding to the outline of the outer table 51. In an example shown in FIG. 6, the plate members 63 are disposed as the adherable members in four sides of the outer table 51. And in an example shown in FIG. 7, the plate members 63 are disposed as the disc-shaped adherable members at interspaces along the outer periphery of the inner table 52. Here, in FIG. 7, the reference numerals 51B show bottomed holes, and the disc-shaped plate members 63 are detachably disposed in the holes 51B. Optionally, for surface treatment of the outer table 51, an alternative arrangement without disposing the plate members 63 can be also adopted that forming adhesive areas, instead of the adherable members, by not providing non-adherable treatment on the areas corresponding to the adherable members.

Additionally, in the above embodiment, a wafer W is intended for the plate-like object. However, the plate-like object in the present invention is not limited to a semiconductor wafer W. Other plate-like objects such as a glass, a steel plate and a resin plate may be included therein. Also, the semiconductor wafer W may include a silicon wafer and a compound wafer. Further, the plate-like object is not limited to a circular shape, but polygonal shapes may be included therein.

What is claimed is:
1. A sheet cutting table for, after sticking an adhesive sheet having a larger plane area than that of a plate object to said plate object, cutting the area outside said plate object as an unnecessary adhesive sheet, said cutting table comprising:
- an inner table which forms a surface to place said plate object thereon; and
- an outer table, which is located outside said inner table, corresponding to said unnecessary adhesive sheet area; wherein
- an upper surface of said outer table is formed as a non-adherable treatment surface, and is provided with an adherable member which is configured for sticking said unnecessary adhesive sheet area thereto;
- said outer table comprises a step which is lower than and located inward from the non-adherable treatment surface; and
- said adherable member is positioned on said step.

2. The sheet cutting table according to claim 1, wherein said adherable member is detachably provided to said outer table, for varying a sticking area of said outer table corresponding to an adhesive force of said adhesive sheet.

3. The sheet cutting table according to claim 1, wherein said adherable member comprises one or more members which are detachably provided to said outer table in a variable number corresponding to an adhesive force of said adhesive sheet.

4. The sheet cutting table according to claim 1, wherein said adherable member is a closed-loop surrounding said inner table.

5. The sheet cutting table according to claim 1, comprising multiple said adherable members which are provided at interspaces around said inner table.

6. The sheet cutting table according to claim 1, further comprising a thermal conduction unit or a heater for warming the adherable member.

7. The sheet cutting table according to claim 1, wherein said adherable member comprises a plurality of concentric rings located around the inner table.

8. The sheet cutting table according to claim 1, wherein said adherable member comprises a plurality of straight members arranged, with interspaces, around the inner table.

9. A sheet cutting table for, after sticking an adhesive sheet having a larger plane area than that of a plate object to said plate object, cutting the area outside said plate object as an unnecessary adhesive sheet, said cutting table comprising:
- an inner table which forms a surface to place said plate object thereon; and
- an outer table, which is located outside said inner table, corresponding to said unnecessary adhesive sheet area; wherein
- an upper surface of said outer table is formed as a non-adherable treatment surface, and is provided with an adherable member which is configured for sticking said unnecessary adhesive sheet area thereto;
- said outer table comprises a plurality of holes which are arranged around the inner table and extend downward from the non-adherable treatment surface; and
- said adherable member comprises a plurality of solid members each removably received in any one of said hole for varying a sticking area of the outer table corresponding an adhesive force of the said adhesive sheet.

10. A sheet cutting table, comprising:
- an inner table for supporting thereon a plate object to which an adhesive sheet having a larger plan area than that of the plate object is to be stuck and cut along a periphery of the plate object; and
- an outer table located outside said inner table, wherein an upper surface of said outer table comprises:
- a non-adherable area contactable with but non-adherable to the adhesive sheet; and
- an adherable area contactable with and adherable to the adhesive sheet; and
- wherein said non-adherable area and said adherable area include different solid materials non-adherable and adherable, respectively, to the adhesive sheet.

11. The sheet cutting table according to claim 10, further comprising
- at least one adherable member removably attached to said outer table to define said adherable area.

12. The sheet cutting table according to claim 11, wherein said at least one adherable member comprises a plurality of adherable members having different sizes for varying a sticking area of said outer table corresponding to an adhesive force of said adhesive sheet.

13. The sheet cutting table according to claim 11, wherein said at least one adherable member comprises a plurality of adherable members removably attached to said outer table in a variable number corresponding to an adhesive force of said adhesive sheet.

14. The sheet cutting table according to claim 10, further comprising
- at least one adherable ring surrounding the inner table and defining said adherable area.

15. The sheet cutting table according to claim 10, further comprising
- a plurality of adherable members arranged, with interspaces, around the inner table to define said adherable area.

16. The sheet cutting table according to claim 10, wherein said outer table comprises a step which is lower than and located radially inward from the non-adherable area; and
- at least one adherable member positioned on said step to define said adherable area.

17. The sheet cutting table according to claim 11, wherein said outer table comprises a plurality of holes which are arranged around the inner table and extend downward from the upper surface of the outer table;
- said adherable member comprises a plurality of adherable members each removably received in any one of said hole for varying a sticking area of the outer table corresponding an adhesive force of the said adhesive sheet; and
- a region of the upper surface of the outer table outside said holes defines the non-adherable area.

* * * * *